United States Patent [19]

Thomas et al.

[11] Patent Number: 4,975,596
[45] Date of Patent: Dec. 4, 1990

[54] AUTOMATICALLY STABILIZED LATCHED DIFFERENTIAL COMPARATOR WITH SINGLE CLOCK

[75] Inventors: Francois Thomas, Vanves; Bertrand Campagnie, Hondschoote, both of France

[73] Assignee: Thomson Hybrides et Microondes, Paris, France

[21] Appl. No.: 275,514

[22] Filed: Nov. 23, 1988

[30] Foreign Application Priority Data

Nov. 27, 1987 [FR] France ................ 87 16465

[51] Int. Cl.$^5$ .................. H03K 3/356; H03K 5/24
[52] U.S. Cl. .................. 307/355; 307/279; 307/530
[58] Field of Search ........... 307/350, 530, 355, 362, 307/279, 291

[56] References Cited

U.S. PATENT DOCUMENTS

| | | | |
|---|---|---|---|
| 3,540,007 | 11/1970 | Hodges . | |
| 4,027,176 | 5/1977 | Heuber et al. | 307/530 |
| 4,150,311 | 4/1979 | Matsuda et al. | 307/279 |
| 4,439,694 | 3/1984 | Fox | 307/279 |
| 4,511,810 | 4/1985 | Yukawa | 307/530 |
| 4,629,911 | 12/1986 | Bebernes et al. | 307/530 |
| 4,717,838 | 1/1988 | Brehmer et al. | 307/279 |
| 4,814,648 | 3/1989 | Hynecek | 307/279 |

FOREIGN PATENT DOCUMENTS 3442649  5/1986  Fed. Rep. of Germany .

OTHER PUBLICATIONS

IEEE Journal of Solid State Circuits, vol. SC-12, No. 5, Oct. 1977, pp. 497–501; T. R. O'Connel, et al.
IEEE 1983, International Symposium on Circuits and Systems, May 2–4, 1983, vol. 3, pp. 1286–1289; P. E. Allen, et al.

Primary Examiner—John Zazworsky
Attorney, Agent, or Firm—Oblon, Spivak, McClelland, Maier & Neustadt

[57] ABSTRACT

A differential comparator, working with microwaves and using only one clock, is disclosed. This comparator has a differential amplifier and a divergence circuit in which are included two voltage level translators. The coupling between the amplifier and the divergence circuit is made at the gates of the load transistors of the divergence circuit. Two insulation transistors, working in either saturated mode or resistive mode, are used to provide the amplifier with an automatic control loop which stabilizes all the rest voltages. The clock signal, applied to two transistors which short circuit the two feedback transistors of the divergence circuit, controls the passage from the measuring phase to the divergence phase.

6 Claims, 2 Drawing Sheets

AUTOMATICALLY STABILIZED LATCHED DIFFERENTIAL COMPARATOR WITH SINGLE CLOCK

BACKGROUND OF THE INVENTION

1. Field of the Invention

The present invention concerns an electronic circuit which is an automatically stabilized, latched differential comparator with pre-amplification and with a single clock. This comparator is designed to work at very high speeds (with microwaves of up to several gigahertz): its single clock, its automatically stabilized rest voltages and its architecture are such that it is affected very little by technological variations in the manufacture of transistors which cause measuring errors or instability.

This comparator has been designed to be made in integrated circuit form using III-V group materials such GaAs but, of course, it can also be made of silicon without going beyond the scope of the invention: only its working speed is lower.

2. Description of the Prior Art

Differential latched comparators use the mechanism of positive feedback the difference in voltages between inputs is found again, after amplification, at the outputs (measurement phase). It is then that these signals are re-injected into the inputs (divergence phase). The fact of looping the outputs back to the inputs leads to a fast amplification of the voltage differences A structure of this type, provided with a balance-resetting circuit, becomes very valuable since it enables the making of comparators with a very small flip-over time.

FIG. 1 gives an example of an electrical diagram of a latched comparator with imbricated differential stages, according the prior art.

The input signals, $E_1$ and $E_2$, addressed to the gates of the transistors $T_6$ and $T_7$, are coupled with the output signals $S_1$ and $S_2$, taken at the gates of the transistors $T_8$ and $T_9$, namely also at the drains of the transistors $T_6$ and $T_7$. In this architecture, it is necessary to have two complementary clocks, $H_1$ and $T_2$, the pulses of which are applied to the gates of the transistors T2 and T3.

This comparator has two imbricated differential stages: an internal stage $T_2+T_4+T_5+T_8+T_9$ and an external stage $T_3+T_6+T_7+T_8+T_9$. In this structure, the passage from the measuring phase to the divergence phase is achieved by switching over the current of the external differential stage to the internal differential stage by means of clocks and transistors, $T_2+T_3$, whereupon the divergence starts.

The voltage level translators (T10, D1, D2, D3, T12) and (T11, D4, D5, D6, T13) are indispensable to compensate for the difference in resting levels existing between the inputs and the outputs.

The drawbacks related to this structure are chiefly:
the need for complementary clocks $H_1$ and $H_2$ without overlapping,
the lack of sensitivity, due to the injection of charges during switching-over operations,
the absence of stabilization of resting levels to cope with technological imperfections, because it is not always verified that:

$$I_{T1}=I_{T4}+I_{T5}$$

the instability of the output signals due to switching-over of current when going from the external stage to the internal stage and vice versa.

A comparator according to the invention makes it possible to overcome these drawbacks through:
compensation for technological variations, due to the stabilization of voltages,
operation with a single clock,
high sensitivity of elimination of the transfer of current between the internal circuit and the external circuit.

The invention uses circuit elements known per se, such as a differential amplifer at input, a divergence circuit and voltage level translators at output, but the coupling between the differential amplifier and the divergence circuit is achieved by means of two voltage followers which isolate the amplifer from the divergence circuit. The rest voltage at the outputs of the amplifier may then be imposed by a automatic control loop. The coupling between the differential amplifier and the divergence circuit is achieved on the gate of the load transistors of this circuit, said transistors being themselves mounted in series, each with an insulation transistor which can work either in resistive mode or in saturated mode.

SUMMARY OF THE INVENTION

More precisely, the invention concerns a latched, differential comparator working at very high frequencies, comprising a differential amplifier, to the inputs of which are applied the signals to be compared, and a divergence circuit in two arms which are symmetrical with the outputs of the amplifier, said divergence circuit comprising, for each arm, three series-mounted transistors, namely a feedback transistor, an insulating transistor and a load transistor, and one voltage level translator, the outputs of the comparator being taken at the outputs of the voltage level translators; a latched differential comparator wherein the coupling between the outputs of the differential amplifier and the divergent circuit is made at the gates of the load transistors of the divergence circuit.

BRIEF DESCRIPTION OF THE DRAWINGS

The invention will be better understood and its operation and advantages will emerge more clearly from the following more detailed description, made with reference the appended figures, of which.

DESCRIPTION OF A PREFERRED EMBODIMENT

Figure 1:
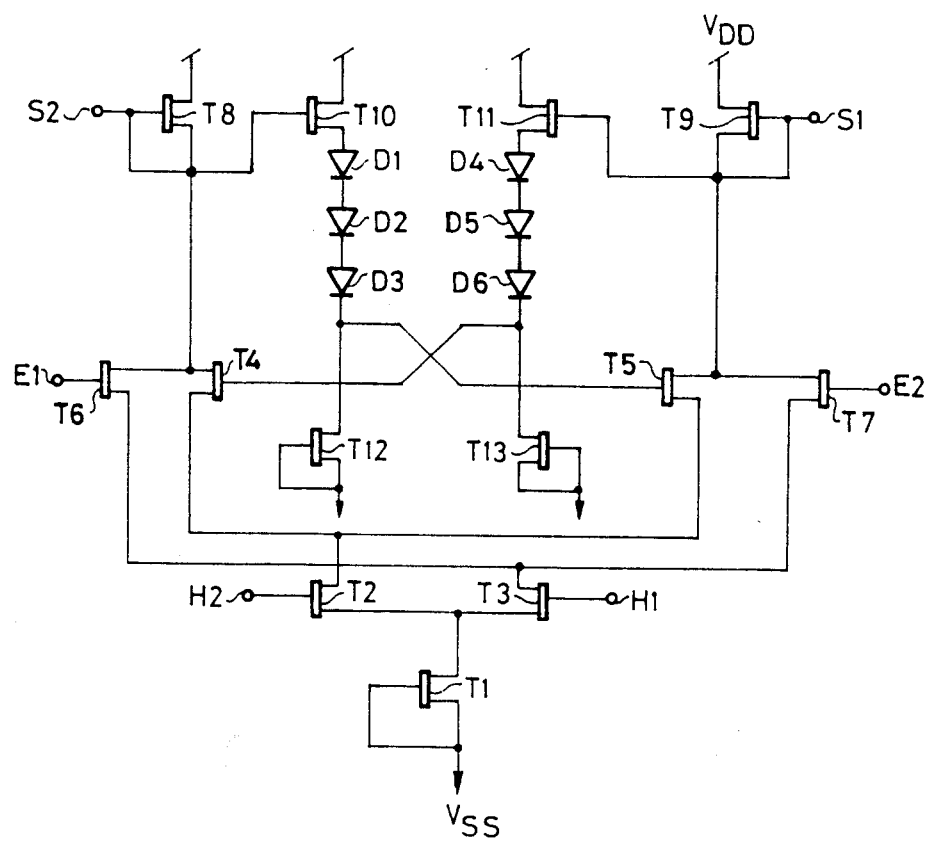
FIG. 1 shows an electrical diagram of a prior art latched comparator which has already been described.
Figure 2:
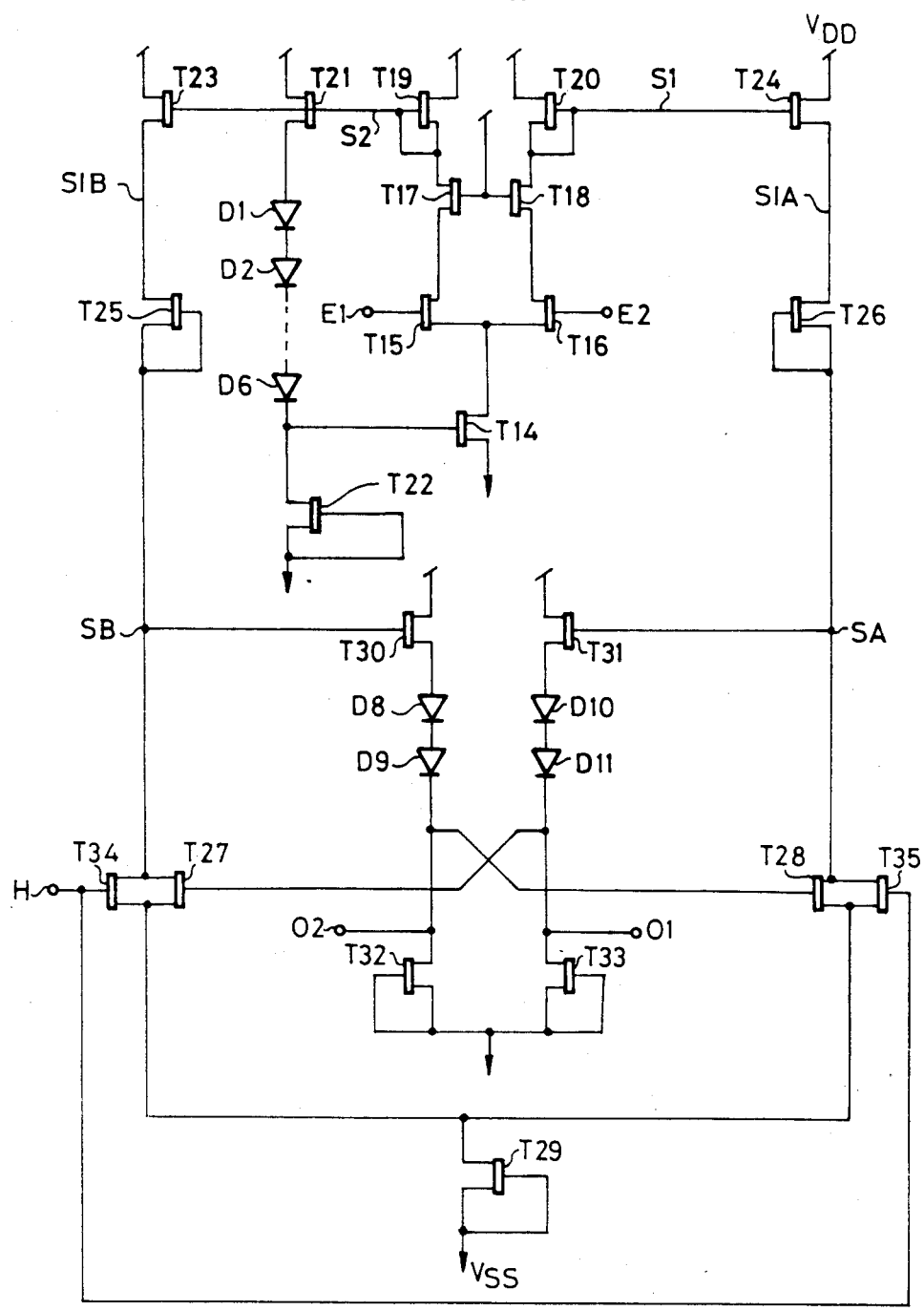
FIG. 2 shows an electrical diagram of an automatically stabilized, latched comparator with a single clock, according to the invention.

The differential comparator according to the invention, shown in FIG. 2, has the following groups of elements:
a pre-amplification circuit which receives the input signals at its inputs, El and E2. It is formed by a known type of cascaded amplifier which groups together the transistors $T_{14}$ to $T_{20}$.
an automatic control loop $T_{21}$, $D_1$ to $D_6$, $T_{22}$ which enables the stabilizing of the rest voltages at the outputs $S_1$ and $S_2$ of the pre-amplifier,
a divergence circuit which is formed by the coupling transistors, $T_{23}$ and $T_{24}$, the insulation transistors, $T_{25}$ and $T_{26}$, and the differential feedback transistors, $T_{27}$, $T_{28}$ and $T_{29}$, and is complemented by two voltage level translators, $T_{30}$, $D_8$, $D_9$, $T_{32}$ and $T_{31}$, $D_{10}$, $D_{11}$, $T_{33}$, the transistors for resetting the balance of the unit, namely the transistors, $T_{34}$ and $T_{35}$ which are parallel mounted with the feedback transistors, $T_{27}$ and $T_{28}$, the signal of the single clock H being applied to the gate of these transistors $T_{34}$ and $T_{35}$.

The output $O_1$ of the comparator is taken at the drain of the transistor 33 of the voltage level translator, and is simultaneously looped to the gate of the feedback transistor $T_{27}$, and the output $O_2$, taken at the drain of the transistor $T_{32}$, is looped to the gate of $T_{28}$.

The unit is supplied between two analog voltages, $V_{DD}$ and $V_{SS}$: these voltages are not all shown in FIG. 2, solely in order to avoid burdening this figure.

The number of diodes, which is six in this automatic control loop and two in each voltage level translator, does not limit the scope of the invention: it corresponds to a technology using GaAs, but may differ according to the technology implemented. These diodes may be replaced by resistors or transistors in technologies having no diodes.

Let SIA and SIB designate the intermediate outputs, between the coupling and insulation transistors $T_{23}$ and $T_{25}$, $T_{24}$ and $T_{26}$, and let SA and SE the intermediate outputs applied to the voltage level translators $T_{30}$ and $T_{31}$.

The transistors used in this assembly are all of the normally on type, i.e. they are conductive if no voltage is applied to their gates.

In brief, this comparator works as follows

The pre-amplification circuit amplifies the voltage difference between the two inputs, E1 and E2. The signals present at the outputs, S1 and S2, of the pre-amplification differential circuit are sent to the divergence stage by means of an original coupling mode, by the load transistors, $T_{23}$ and $T_{24}$, of the divergence stage If the clock H is at the low logic level, $T_{27}$ and $T_{28}$ are on, $T_{34}$ and $T_{35}$ are off, and the divergence starts since the output signals are sent to the inputs of the divergence stage (the gates of $T_{27}$ and $T_{28}$). After the divergence of SA and SB, the circuit is restored to balance by placing the clock H at the high logic level, following which a divergence cycle can be started again.

In a more detailed way, a comparison has to be made between the voltage at El and the voltage at E2. The voltage difference V (E1)−V (E2) is then amplified by a factor G which is the gain of the amplifier. We then have:

$$V(S1)-V(S2)=G.(V(E1)-V(E2)).$$

Thereafter, it is necessary to consider two phases of operation:

phase 1: the clock H is in the high logic state: the transistors $T_{34}$ and $T_{35}$ are on; $T_{27}$ and $T_{28}$ are therefore short-circuited. The insulation transistors $T_{25}$ and $T_{26}$ are not saturated because the width of their gates is between that of the gate of the current source $T_{29}$ and that of the gate of the coupling transistors $T_{23}$ and $T_{24}$. As a non-restrictive example, $T_{23}$ and $T_{24}$ have a gate width of 5 microns, $T_{25}$ and $T_{26}$ have a gate width of 7.5 microns, and $T_{29}$ has a gate width of 10 microns. For, since the intensity imposed by a current source (a transistor having a null gate/source voltage) is proportionate to the size of the transistor, and since $2\times 7.5=15>10$, $T_{25}$ and $T_{26}$ cannot both be simultaneously saturated. $T_{25}$ and $T_{26}$ therefore work in resistive mode.

Consequently, the two symmetrical sets formed by the coupling, insulation and balance-resetting transistors, $T_{23}+T_{25}+T_{34}$ and $T_{24}+T_{26}+T_{35}$, form two follower/shifter circuits. For the gate/source voltage of $T_{34}$ is equal to that of $T_{35}$ and the current in the left-hand arm is equal to that in the right-hand arm. The gate-source voltages of $T_{23}$ and $T_{24}$ are therefore equal. Thus, the difference VS1−VS2 is carried over to between the points SIA and SIB.

Since $T_{25}$ and $T_{26}$ are identical, crossed by one and the same current and working in resistive mode, their drain/source voltages are equal. We thus deduce therefrom that:

$$V(SA)-V(SE)=V(S1)-V(S2)=G.(V(E1)-V(E2)).$$

It is after this pre-amplification that the divergence phase can start.

Phase 2: in the divergence phase, the clock H is at the low logic level: $T_{34}$ and $T_{35}$ are off and no longer play a role in the operation of the circuit. $T_{27}$ and $T_{28}$ are thereafter no longer short-circuited. We are dealing here with a standard type of latched differential circuit. The voltage difference $V(SA)-V(SB)$ is reinjected into the gates of $T_{27}$ and $T_{28}$ by means of two voltage level translators. There is then a divergence between the voltages at SA and SB. This is a very fast phenomenon. In this case, one of the transistors, $T_{25}$ or $T_{26}$, works in a saturated mode.

In short, a small difference between the voltages at E1 and E2 quickly leads to a big difference between the output voltages $O_1$ and $O_2$.

The originality of this architecture lies in:

the coupling mode between the pre-amplification stage and the divergence stage by the load transistors, $T_{23}$ and $T_{24}$, of this divergence stage, the presence of the insulation transistors $T_{25}$ and $T_{26}$ which can work, sometimes in resistive mode and sometimes in saturated mode, and the role of which shall be explained further below, the automatic control loop, which is permitted by the insulation of the pre-amplifier due to the coupling mode and which stabilizes the rest voltages.

the single clock, the stabilization and single clock being advantages created by the coupling mode.

With respect to the stabilization of all the rest voltages, the automatic control loop, $T_{21}$, $D_1$ to $D_6$, $T_{22}$, has the role of stabilizing the rest voltages at S1 and S2 by automatic control of the current in $T_{14}$, and by means of the coupling mode used between the pre-amplification circuit and the divergence circuit. Since it has been shown that, in the measuring phase (with the clock at the top state), the elements $T_{23}$, $T_{25}$, $T_{34}$ as well as $T_{24}$, $T_{26}$, $T_{35}$ form two voltage followers, the rest voltages at SA and SB are imposed. Furthermore, since the elements $T_{30}$, $D_8$, $D_9$, $T_{32}$ and $T_{31}$, $D_{10}$, $D_{11}$, $T_{33}$ also form voltage followers, the resting levels of O1 and O2 are also imposed. In short, the above-described automatic control loop stabilizes all the rest voltages of the circuit.

The need for a single clock H, which is easier to make than two complementary clocks, to pass from the measuring phase to the divergence phase warrants the presence of the insulation transistors $T_{25}$ and $T_{26}$.

In the standard latched comparators, there have to be complementary clocks to make it possible to send, alternately, to the inputs, the voltages to be measured (measuring phase) and those obtained at the differential outputs (divergence phase).

These two phases can be achieved with a single clock. When the clock H is the low logic state, the comparator is in the divergence phase. When the clock is in the high logic state, the difference $V(SA)-V(SB)$ is equal to $G(V(E1)-V(E2))$. In the divergence phase, the inputs E1 and E2 no longer have any effect on the direction of the divergence if the input signals can no longer make the comparator change its decision: this is made possible by the insulation transistors, $T_{25}$ and $T_{26}$. Let us consider the operation steps:

step 1: let us assume that $V(S1)-(V(S2)$ is small. Then $V(SA)-V(SB)$ is also small during the measuring phase.

step 2: the divergence phase begins The voltages SA and SB will diverge greatly from their resting levels Let us also assume that the sign of $V(E1)-V(E2)$ is positive while $V(S1)>V(S2)$ and $V(SA)>V(SB)$, and during the divergence phase, $V(SA)$ increases while $V(SB)$ decreases greatly.

It is deduced therefrom that the difference in voltage between S2 and SB increases. This tends to cause an increase in the current in $T_{23}$. However, this current is limited by $T_{25}$ which gets into saturated mode Thereupon, the voltage S2 no longer has any influence on $V(SB)$ since these two nodes are connected by a current source.

As for the right-hand arm, the voltage between S1 and SA decreases and $T_{26}$ gets into resistive mode.

step 3: if a sudden variation in the input voltages leads to the fact that $V(S1)-V(S2)$ changes its sign ($V(S1)<V(S2)$) during the divergence phase, hence before the system is in the measurement phase, it has been seen earlier that S2 no longer influences SB and that, therefore, owing to the differential nature of the circuit, $V(S1)-V(S2)$ no longer acts on the sign of $V(SA)-V(SB)$.

In short, when the divergence phase has begun, the input signals can no longer make the system change its decision before returning to the measurement phase.

What is claimed is:

1. A latched, differential comparator operating at high frequencies for comparing a first signal and a second signal, said comparator comprising:
   a differential amplifier having a first input and a second input for receiving said first and second signals respectively and for providing first and second amplified output signals;
   a divergence circuit having a first portion and a second portion for respectively receiving said first amplified output signal and said second amplified output signal of said differential amplifier, said divergence circuit comprising, for each portion, three series-mounted gated transistors including a feedback transistor, an insulating transistor, and a load transistor, and a voltage level translator, wherein the output of each of said voltage level translators of said first portion and said second portion provide the output of said comparator;
   said latched differential comparator being characterized in that a coupling between said first amplified output signal and said second amplified output signal of said differential amplifier and the divergence circuit occurs at the gates of said load transistors of said divergence circuit.

2. A latched, differential comparator according to claim 1 further including a gated current transistor acting as a current source and wherein, in each portion of the divergence circuit, the insulation transistors have a gate width which is smaller than the gate width of said current transistor which is the current source of the divergence circuit, but is greater than the gate width of the load transistors of the divergence circuit, and consequently work either in resistive mode or in saturated mode.

3. A latched, differential comparator according to claim 1, wherein the insulation and load transistors insulate the differential amplifier from high amplitude signals present in the divergence circuit.

4. A latched, differential comparator according to claim 1, further comprising two gated balance resetting transistors, each mounted in parallel with one of the feedback transistors of the divergence circuit wherein a single clock signal is applied to the gates of said two resetting transistors.

5. A latched, differential comparator according to claim 1, wherein all the transistors of the circuit are of the normally on type.

6. A latched, differential comparator according to claim 1, made in integrated circuit form with a material of the III-V group such as GaAs.

* * * * *